(12) United States Patent
Robillard et al.

(10) Patent No.: US 7,577,767 B1
(45) Date of Patent: Aug. 18, 2009

(54) DATA STORAGE SYSTEM HAVING PLURAL STORAGE PROCESSORS IN A SINGLE CHASSIS

(75) Inventors: Michael N. Robillard, Shrewsbury, MA (US); Timothy Dorr, North Attleboro, MA (US); Sharon Smith, Brookline, MA (US)

(73) Assignee: EMC Corporation, Hopkinton, MA (US)

( * ) Notice: Subject to any disclaimer, the term of this patent is extended or adjusted under 35 U.S.C. 154(b) by 382 days.

(21) Appl. No.: 11/224,509

(22) Filed: Sep. 9, 2005

(51) Int. Cl.
*G06F 3/00* (2006.01)
(52) U.S. Cl. .......................... 710/15; 324/161; 324/166; 348/461
(58) Field of Classification Search .................... 710/15, 710/18
See application file for complete search history.

(56) References Cited

U.S. PATENT DOCUMENTS

| | | | |
|---|---|---|---|
| 6,363,449 B1 * | 3/2002 | Sides et al. .................. | 710/100 |
| 6,545,438 B1 * | 4/2003 | Mays, II ................ | 318/400.01 |
| 6,604,207 B2 * | 8/2003 | Sheikh et al. ................... | 714/1 |
| 2002/0042896 A1 * | 4/2002 | Johnson et al. ................ | 714/47 |
| 2002/0054477 A1 * | 5/2002 | Coffey et al. ................ | 361/686 |

* cited by examiner

*Primary Examiner*—Henry W. H. Tsai
*Assistant Examiner*—Elias Mamo

(57) ABSTRACT

An interface for coupling data between a host computer/server and a bank of disk drives. The interface includes a chassis having disposed therein: a pair of storage processors adapted for coupling to the host computer/server; and, a pair of management controllers in communication one with the other through a communication link. The management controllers monitor elements of the interface including fans and power supplies and control such elements in response to massages passing between the management controllers.

6 Claims, 4 Drawing Sheets

DATA STORAGE SYSTEM HAVING PLURAL STORAGE PROCESSORS IN A SINGLE CHASSIS

TECHNICAL FIELD

This invention relates generally to data storage systems and more particularly to data storage systems having plural storage processors in a single chassis being monitored by multiple management controllers that monitor and share resources.

BACKGROUND

As is known in the art, many host computers/servers store data in, and retrieve data from, a bank of disk drives through a system interface. The system interface includes CPU controllers, commonly referred to as storage processors.

Typically a pair of such processors is used for redundancy. More particularly, a typical data storage system might include one or more storage processors, each with its own power and cooling subsystems. Each storage processor could be enclosed in a chassis with its own attendant subsystems.

SUMMARY

In accordance with the present invention, an interface is provided for a data storage system. The interface couples data between a host computer/server and a bank of disk drives. The interface includes a chassis having disposed therein: a pair of storage processors adapted for coupling to the host computer/server; and, a pair of management controllers in communication one with the other through a communication link. Each one of the management controllers is coupled to a corresponding one of the pair of storage processors. The pair of storage processors is configured for passing data between the bank of disk drives and the host computer/server. A fan section is included in the chassis having a plurality of fan units, each one of the fan units being responsive to a common speed control signal and producing a speed indication signal indicative of speed of a fan in such one of the fan units. A first one of the fan units produces a speed indication signal monitored by only a first one of the pair of management controllers. A second one of the fan units produces a speed indication signal monitored by only a second one of the pair of management controllers. Remaining ones of the fan units produce a speed indication signal monitored by both management controllers. A common speed control signal is produced for all the fan units in response to messages passing between the pair of management controllers, such messages being generated in response to speed indication signals fed to the pair of management controllers.

Thus, the pair of management controllers, in communication one with the other, share information (via the messages), and resources so that each management controller can individually, or in unison, determine whether or not to take action. The use of multiple management controllers that monitor and share multiple resources reduces the number of resources needed while maintaining high availability. Thus, the pair of management controllers in communication one with the other reports fan unit status to the storage processors and generates a fan speed control signal to ensure that both storage processors receive adequate cooling.

In one embodiment, the chassis includes a pair of temperature sensors each one producing a temperature signal for a corresponding one of the pair of storage processors. In response to each temperature signal, the management controller produces the speed control signal for the fan units.

In one embodiment, the chassis includes a pair of power supplies coupled to a common power bus. The power bus is connected to the bank of disk drives and the fan unit. A first one of the pair of power supplies is monitored by a first one of the pair of management controllers and a second one of the pair of power supplies is monitored by a second one of the pair of management controllers. Control signals are provided to the pair of power supplies in response to messages passing between the pair of management controllers, such messages being generated in response to signals produced by each one of the pair of power supplies.

Thus, each one of the pair of power supplies is monitored by a corresponding one of the pair of management controllers. The pair of management controllers in communication one with the other reports power supply status to the storage processors and controls each power supply such that both supplies are on if either storage processor requires power.

In one embodiment a common switch is provided for turning the pair of storage processors to an "on" state or an "off" state, such state being monitored by the pair of management controllers.

With such an arrangement, a system is provided for providing the intercommunication and control necessary to physically co-locate two storage processors with a group of shared power and cooling resources in a single chassis. Co-location of multiple storage processors within a single chassis under the control of redundant enclosure management controllers provides high availability without duplication of any shared resources.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
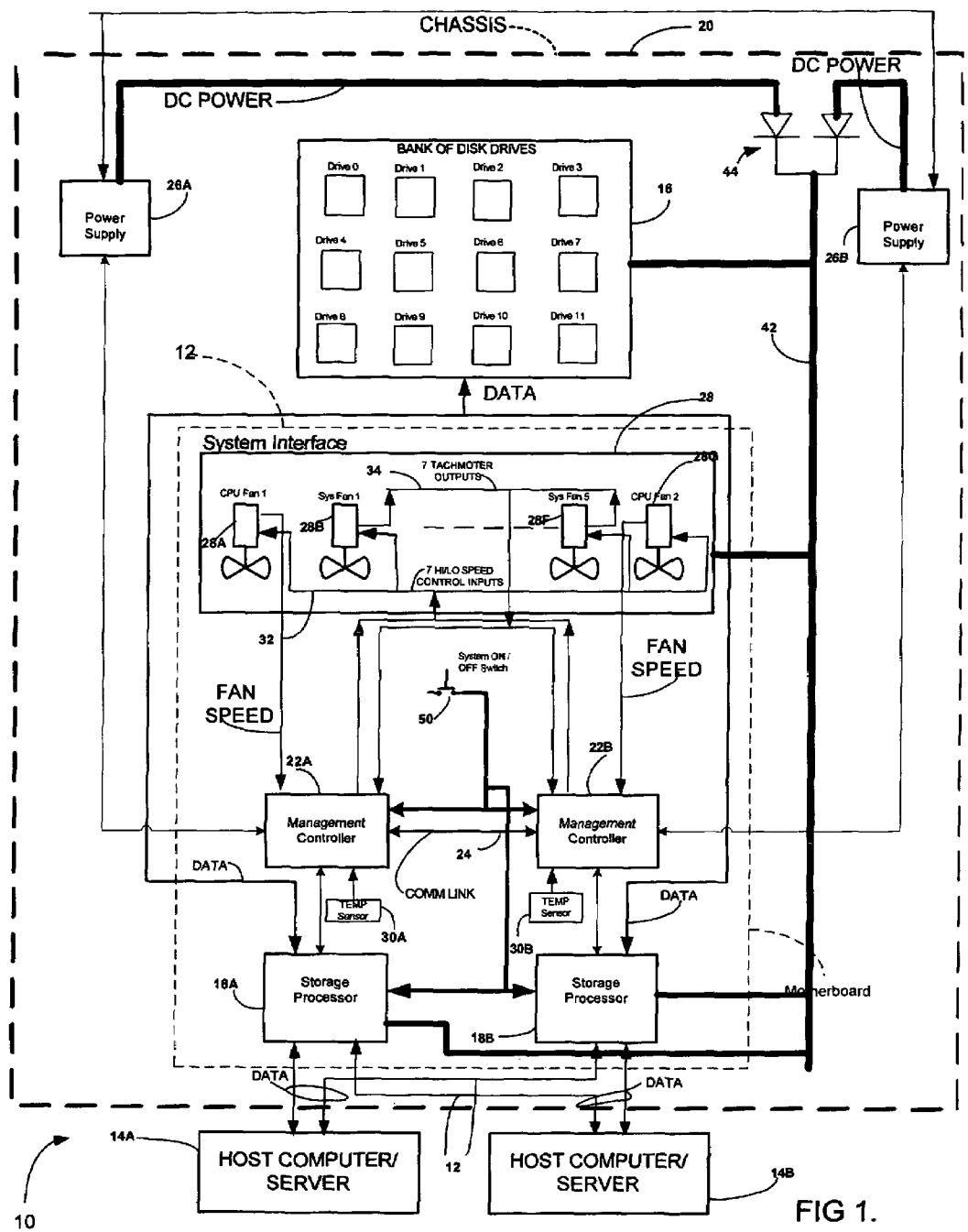
FIG. 1 is a diagram of a data storage system according to the invention.

Referring now to FIG. 1, a chassis 20 is provided for a data storage system 10. The chassis 20 has disposed therein a system interface 12 for coupling data between host computer/servers 14A, 14B and a bank of disk drives 16. Here the system interface 12 is disposed on a common motherboard, as indicated.

The system interface includes: a pair of data storage processors 18A, 18B adapted for coupling to the host computer/server 14A, 14B; and, a pair of management controllers 22A, 22B in communication one with the other through a communication link 24. Each one of the management controllers 22A, 22B is coupled to a corresponding one of the pair of storage processors 18A, 18B. The pair of storage processors 18A, 18B, is configured for passing data between the bank of disk drives 16, also included in the chassis 20, and the host computer/server 14A, 14B. A fan section 28 is included in the chassis 20 having a plurality of fan units 28A-28G, each one of the fan units being responsive to a speed control signal and producing a speed indication signal indicative of speed of a fan in such one of the fan units in a manner to be described.

More particularly, the data passes through a pair of storage processors 18A, 18B. As shown, storage processor 18A is coupled between: (1) both host computer/server 14A and host computer/server 14B, for redundancy, and the bank of disk drives 16. Likewise, storage processor 18B is coupled between: (1) both host computer/server 14A and host computer/server 14B, for redundancy, and the bank of disk drives 16.

Each one of the management controllers 22A, 22B is coupled to a corresponding one of the pair of storage processors 18A, 18B, a corresponding one of a pair of power supplies 26A, 26B, also disposed in the chassis 20, the fan unit 28, and a corresponding one of a pair of temperature sensors 30A, 30B, respectively, also disposed within the chassis 20.

The fan section 28 has a plurality of, here seven, for example, fan units 28A-28G. Fan unit 28A is proximate to storage processor 18A and fan unit 28G is proximate to storage processor 18B. One of the fan units 28A-28G, here fan unit 28A has its speed control signal provided to only one of the pair of management controllers, here by management controller 22A. Likewise, another one of the fan units 28A-28G, here fan unit 28G, has its speed control signal provided to only one of the pair of management controllers, here by management controller 22B. The remaining 5 five units 28B-28F have there speed control signals provided to both management controllers 22A, 22B. A common speed control signal is provided to all the fan units 28A-28G, such common speed control signal being produced in response to messages passing between the pair of management controllers, such messages being generated in response to the speed indication signal produced by each one of the fan units as will be described in more detail in connection with FIG. 2. Here, each speed control signal is either a high speed or normal speed control level.

The chassis 20, as noted above, includes the pair of temperature sensors 30A, 30B. Temperature sensor 30A is proximate storage processor 18A while temperature sensor 30B is proximate storage processor 18B. Thus, each one of the temperature sensors 30A, 30B produces a temperature signal for a corresponding one of the pair of storage processors 18A, 18B, respectively. Temperature sensor 30A is connected to management controller 22A while temperature sensor 30B is connected to management controller 22B. The management controllers 22A, 22B, in response to each temperature signal produces the speed control signal for the each of the fan units and receives the speed indication signal from each of the fan units.

Figure 2:
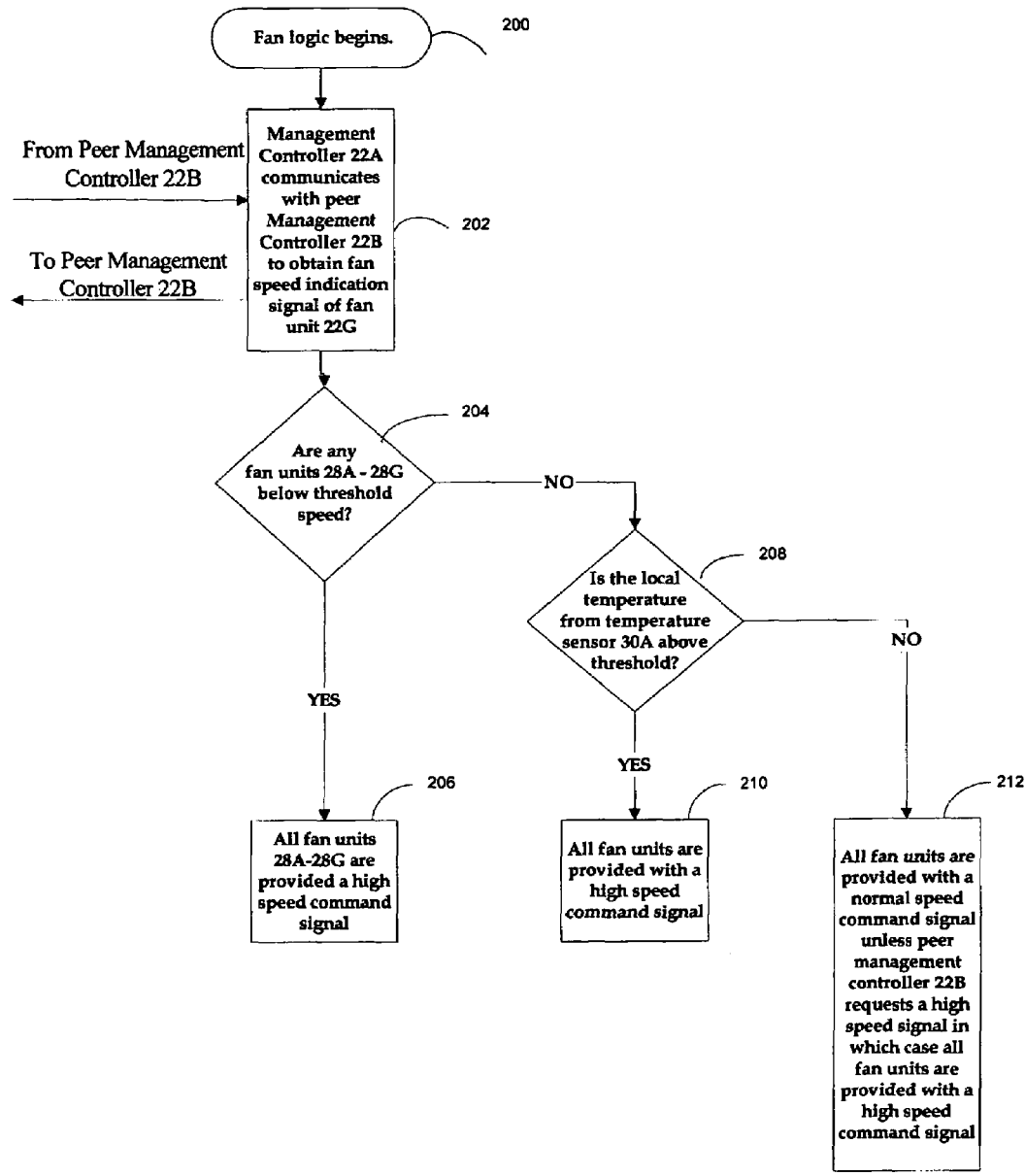
FIG. 2 is a flow diagram of a process wherein management controllers used in an interface of the system of FIG. 1 communicate to share fan status information over a communication link according to the invention.

The pair of management controllers 22A, 22B in communication one with the other via the communication link 24 produce the common speed control signal for the fan units 28A-28G. The speed control signal may be either "normal" speed or "high" speed. The high or normal speed control level is supplied by the management controllers 22A, 22B as follows but not limited to:

IF ((fan tachometer 28A or 28B or . . . 28G<low tachometer threshold) OR (Temperature sensor>system high temperature threshold))
  Speed control signal=high speed;
ELSE
  Speed control signal=normal speed;

Thus, the process described above is performed by each one of the management controllers 22A, 22B and may be presented, for any one of such controllers 22A, 22B by the flow diagram in FIG. 2. FIG. 2 depicts the events that take place for the management controller 22A. It should be understood that management controller 22B operates in the same manner except it receives an indication from management controller 22A as to the speed of fan unit 28A. It should also be noted that if one management controller requests a high speed and the other a normal speed, the high speed request is transmitted as the common speed control signal to all of the fan units 28A-22G.

The fan logic begins in Step 200. First, the management controller, 22A communicates with management controller 22B to obtain the speed indication signal of fan unit 28G, Step 202. Now management controller 28A has knowledge of the speed of all fan units 22A-22G. After this, the controller 22A determines whether the speed of any fan unit 22A-22G is below a predetermined threshold, Step 204. If any one of the fan units 22A-22G has a speed below the predetermined threshold, the fan speed for all fan units 28A-28G is set to a high speed, Step 206. On the other hand, if none of the fan units 22A-22G is below the predetermined threshold, each one of the controllers 22A, 22B determines if the temperature within the chassis 20 is above a predetermined threshold, Step 208. If not, the fan speed for all of the fan units 28A-28G is made unless peer management controller 22B requests a high speed signal in which case all fan units are provided with a high speed common signal, Step 212; on the other hand, if the temperature within the chassis 20 is above the predetermined threshold, the fan speed for all the fan units 28A-28G is set high, Step 210.

Figure 3:
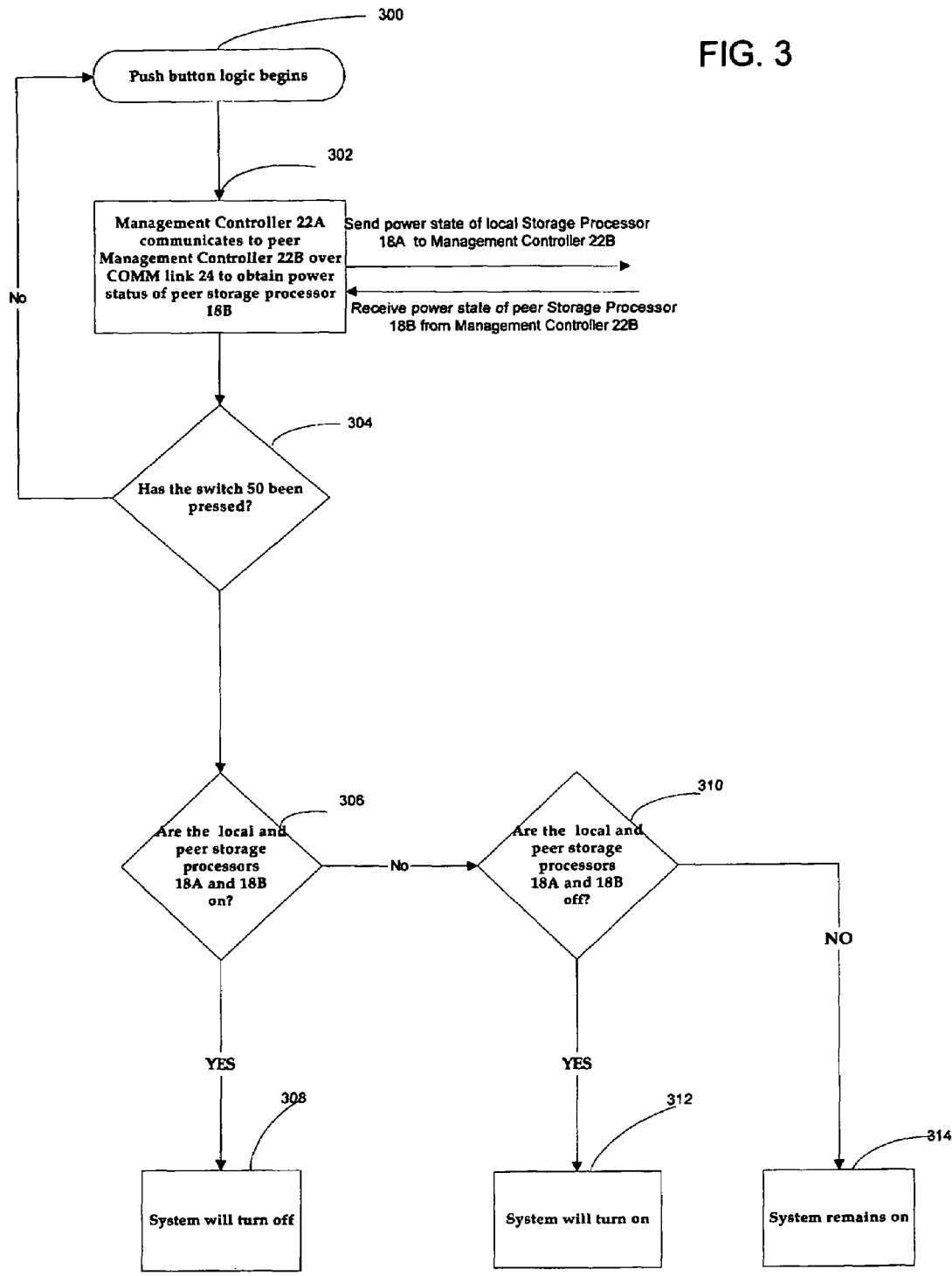
FIG. 3 is a flow diagram of a process wherein management controllers used in an interface of the system of FIG. 1 share status information of the storage processors over the communication link.

A common switch 50 is provided for turning the pair of storage processors 18A, 18B to an "on" state or an "off" state, such state is monitored by the pair of management controllers 22A, 22B. Using one switch that is monitored by two independent management controllers eliminates undesired system states. More particularly, the pair of management controllers 22A, 22B operates as follows:
  IF (Storage processors are on AND switch is pressed)
    Start shutting off the system
  ELSE IF (Storage processors are off AND switch is pressed)
    Turn system on
  ELSE IF (Local storage processor is on and peer storage processor is off and switch is pressed)
    System stays on
  ELSE IF (Local storage processor is off and peer storage processor is on and switch is pressed)
    System stays on Thus, the process described above is performed by each one of the management controllers 22A, 22B and may be presented, for any one of such controllers 22A, 22B by the flow diagram in FIG. 3. FIG. 3 depicts the events that take place for the management controller 22A. It should be understood that management controller 22B operates in the same manner except it receives an indication from management controller 22A as to power state of storage processor 18A. It is also noted that when considering controller 22A, the term local storage processor refers to storage processor 18A and peer storage processor refers to storage processor 18B. Thus, for the process used by management controller 22B, the local processor would be processor 18B and the peer processor would be processor 18A.

The push button logic begins in Step 300. After this, the management controller 22A communicates with management controller 22B to obtain the power status of the peer storage processor (i.e., processor 18B), step 302. Then management controller, 22A determines whether the common switch 50 has been pressed, Step 304. If the switch has not been pressed, the process returns to Step 300. If the switch has been pressed, then the management controller, 22A determines whether both storage processor 18A, 18B are on, Step 306. If both processors 18A, 18B are determined to be on (and the button was pressed in Step 304) the system will turn off in Step 308.

On the other hand, if in Step 306, if the controller, 22A determines that both storage processors 18A, 18B are not on, the controller, 22A will then determine if the local processor 18A and peer processor 18B are off, Step 310. If the both processors are off (and the button has been pressed in Step 304) then the system will turn on, Step 312. If the processors are not both off then the system will remain on, Step 314.

Figure 4:
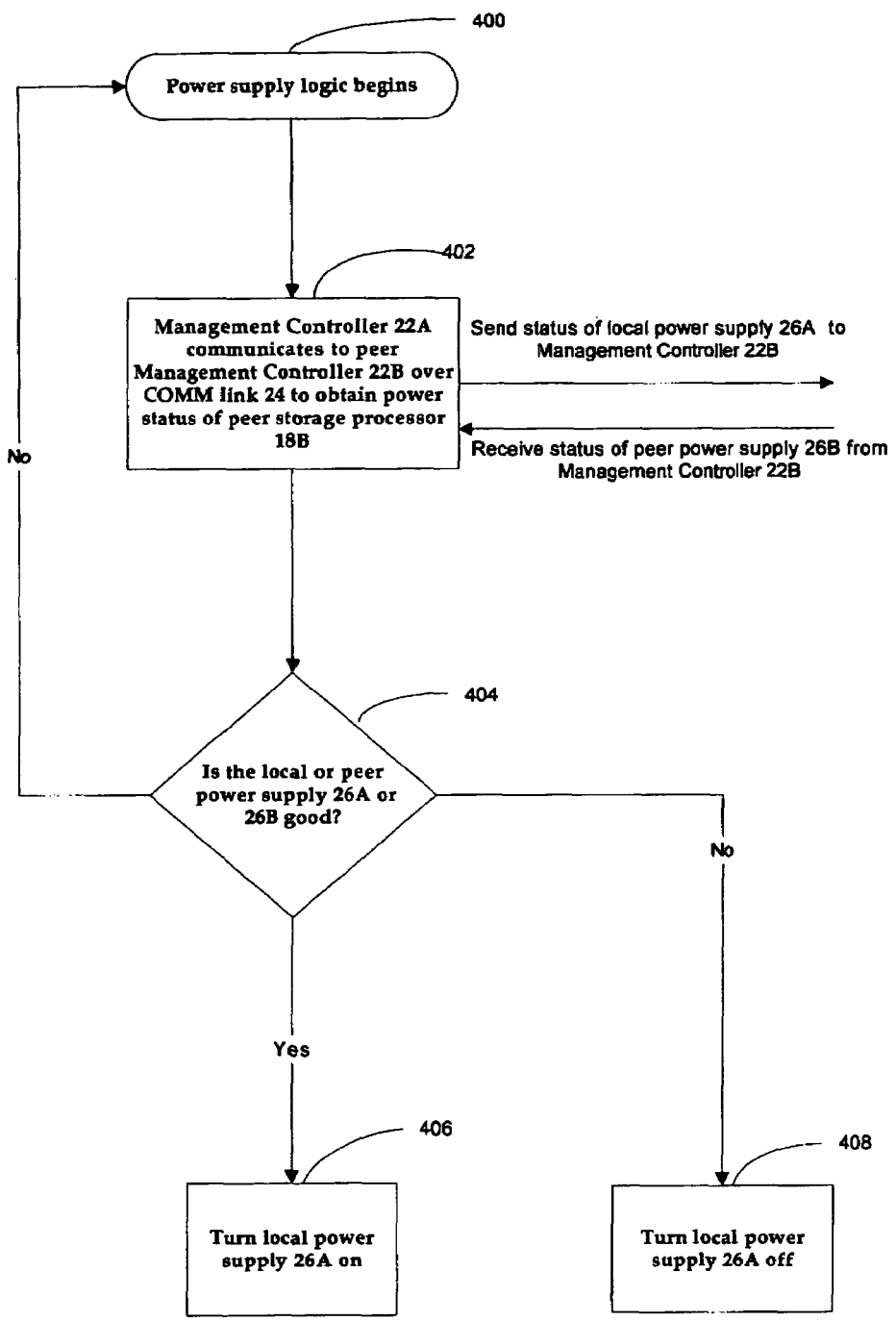
FIG. 4 is a flow diagram of a process wherein management controllers used in an interface of the system of FIG. 1 share power supply status information over the communication link.

The pair of power supplies 26A, 26B are coupled to a common power bus 42 through an OR logic 44 in any conventional manner. The power bus 42 is connected to the bank of disk drives 16 and the fan unit 28. The status, of one of the pair of power supplies 26A, 26B is monitored by a corresponding one of the pair of management controllers 22A, 22B, respectively. Each management controller communicates its status of its monitored power supply to the other (i.e., peer) management controller over the communication link 24 eliminating the need for both management controllers 22A, 22B to monitor both power supplies. More particularly, the pair of management controllers 22A, 22B operates as follows:

IF (Local or peer power supply is good)
        Turn local power supply on
    ELSE
        Turn local power supply off Thus, the process described above is performed by each one of the management controllers 22A, 22B and may be presented, for any one of such controllers 22A, 22B by the flow diagram in FIG. 4. FIG. 4 depicts the events that take place for the management controller 22A. It should be noted that when considering controller 22A, the term local power supply refers to power supply 26A and peer power supply refers to power supply 26B. Thus, for the process used by management controller 22B, the local power supply would be power supply 26B and the peer power supply would be power supply 26A.

The power supply logic begins in Step 400. After this, the management controller 22A communicates with management controller 22B to obtain the status of the peer power supply (i.e., 26B), step 402. Then management controller, 22A determines if the local power supply or peer power supply is good, Step 404. If either power supply is good, then the management controller 22A will turn the local power supply 26A on, Step 406. Otherwise if the power supplies are not good the management controller 22A will turn the local power supply 26A off, step 408.

The pair of management controllers 22A, 22B are in communication one with the other via communication link, here a serial data link, 24. Each management controller 22A, 22B, shares information with each other over the communications link 24. This serial communication link limits the number of signals each management controller needs to monitor by sending information the other management controller needs to know over the serial interface. Hence reducing the number of resources needed in the described system.

A number of embodiments of the invention have been described. Nevertheless, it will be understood that various modifications may be made without departing from the spirit and scope of the invention. For example, multiple storage processors, more/less disks, more/less fans, more power supplies may be included in the chassis. Accordingly, other embodiments are within the scope of the following claims.

What is claimed is:

1. An interface for coupling data between bank of disk drives and a host computer/server, such interface comprising:
    a chassis having therein:
        a pair of storage processors adapted for coupling between the host computer/server and the bank of disk drives;
        a pair of management controllers in communication one with the other through a communication link, each one being coupled to a corresponding one of the pair of storage processors;
        a fan section having a plurality of fan units, the fan units being responsive to a common speed control signal and each one of the fan units producing a speed indication signal indicative of speed of a fan in such unit, and
        wherein a first one of the fan units produces a speed indication signal monitored by only a first one of the pair of management controllers;
        a second one of the fan units produces a speed indication signal monitored by only a second one of the pair of management controllers; and
        remaining ones of the fan units produce a speed indication signal monitored by both management controllers; and
        wherein the common speed control signal is produced for all the fan units in response to messages passing between the pair of management controllers, such messages being generated in response to speed indication signals fed to the pair of management controllers.

2. The chassis recited in claim 1 wherein the chassis includes a single on/off switch monitored by the pair of management controllers.

3. The interface recited in claim 1 wherein the chassis includes a pair of temperature sensors each one producing a temperature signal for a corresponding one of the pair of management controllers, wherein in response to each temperature signal the common speed control signal is produced for the fan units.

4. The interface recited in claim 1 wherein the chassis includes the bank of disk drives and wherein the chassis includes a pair of power supplies coupled to a common power bus, such power bus being connected to the bank of disk drives and the fan unit, and wherein each one of such pair of power supplies produces a status signal monitored by only a corresponding one of the pair of management controllers.

5. An interface for coupling data between bank of disk drives and a host computer/server, such interface comprising:
    a chassis having therein:
        a pair of storage processors adapted for coupling between the host computer/server and the bank of disk drives;
        a pair of management controllers in communication one with the other through a communication link, each one being coupled to a corresponding one of the pair of storage processors;

a pair of power supplies coupled to a common power bus, such power bus being connected to the bank of disk drives;

a first one of the pair of power supplies being monitored by only a first one of the pair of management controllers and a second one of the pair of power supplies being monitored by only a second one of the pair of management controllers and wherein each one of the pair of management controllers provides a power on or power off control signal to the monitored one of the pair to the pair of power supplies in response to messages passing between the pair of management controllers, such messages being generated in response to signals produced by each one of the pair of power supplies.

6. The interface recited in claim 5 wherein the chassis includes a single on/off switch monitored by the pair of management controllers.

* * * * *